(12) United States Patent
Johnson

(10) Patent No.: US 6,204,770 B1
(45) Date of Patent: Mar. 20, 2001

(54) MASTER AUTOMOTIVE SENSOR TESTER

(75) Inventor: Arthur D. Johnson, Muskego, WI (US)

(73) Assignee: Echlin, Inc., Branford, CT (US)

( * ) Notice: Subject to any disclaimer, the term of this patent is extended or adjusted under 35 U.S.C. 154(b) by 0 days.

(21) Appl. No.: 09/095,778

(22) Filed: Jun. 11, 1998

(51) Int. Cl.$^7$ .................................................. G08B 21/00
(52) U.S. Cl. ................... 340/660; 73/35.03; 123/406.16; 324/537; 324/384
(58) Field of Search .......................... 123/339.14, 406.38, 123/406.35, 406.36, 406.16; 340/660; 73/35.03; 324/537, 765, 555, 556, 727, 388, 384

(56) References Cited

U.S. PATENT DOCUMENTS

| Re. 33,692 | 9/1991 | Hirano et al. ........................ 324/537 |
|---|---|---|
| 3,646,438 | 2/1972 | Staff ................................... 324/73 R |
| 4,112,748 | 9/1978 | Walley ................................. 73/118 |
| 4,300,205 | 11/1981 | Tansuwan ........................... 364/578 |
| 4,401,949 | 8/1983 | Gold .................................... 324/402 |
| 4,447,801 | 5/1984 | Masuda ............................. 340/52 F |
| 4,467,634 | * 8/1984 | Rohde et al. .......................... 73/35 |
| 4,621,602 | * 11/1986 | Furuyama ............................ 123/425 |
| 4,651,698 | * 3/1987 | McDermott et al. ................ 123/425 |
| 4,673,868 | 6/1987 | Jones, Jr. ............................. 324/51 |
| 4,962,456 | 10/1990 | Abe et al. ........................ 364/431.01 |
| 5,119,782 | * 6/1992 | Kashiwabara et al. .............. 123/422 |
| 5,235,527 | 8/1993 | Ogawa et al. ................... 364/571.05 |
| 5,250,908 | 10/1993 | Liu et al. ............................. 324/542 |
| 5,359,290 | * 10/1994 | Cervas ................................. 324/384 |
| 5,687,082 | * 11/1997 | Rizzoni ........................... 364/431.08 |

* cited by examiner

*Primary Examiner*—Daniel J. Wu
*Assistant Examiner*—Anh La
(74) *Attorney, Agent, or Firm*—St. Onge Steward Johnston & Reens LLC

(57) ABSTRACT

A sensor tester for testing multiple vehicle sensors is provided comprising: a circuit for testing a vehicle piezoelectric knock sensor; a circuit for testing a vehicle speed sensor; and a circuit for testing ignition coils. The circuit for testing piezoelectric knock sensors comprises: an integrated circuit electrically connectable to a power source, the integrated circuit having a multiple step voltage divider, a connector for connecting the integrated circuit to the knock sensor; and a plurality of light emitting diodes electrically connected to the voltage divider of the integrated circuit. The circuit for testing vehicle speed sensors comprises: a voltage divider for limiting the voltage of a power source to a reference voltage; a voltage comparator having a first input, a second input and an output, the first input electrically connected to the voltage divider, the second input electrically connected to the speed sensor; and a voltage transition detector for detecting a voltage transition from the output of the voltage comparator. The circuit for testing ignition coils that have a primary coil and a secondary coil comprises: capacitance means electrically connectable in a loop with a power source and the primary coil; a first voltage indicator electrically connected in series with a side of the secondary winding and electrically connectable to the power source; a second voltage indicator for detecting a voltage across the capacitance means; a current interrupter electrically connected in parallel with the capacitance means; a first connector for connecting the power source in series with the primary coil; and a second connector for connecting the power source in series with the secondary coil.

12 Claims, 5 Drawing Sheets

MASTER AUTOMOTIVE SENSOR TESTER

FIELD OF THE INVENTION

The invention relates to a device for testing the performance of electronic sensors, and more particularly, to a device for off vehicle testing of various electronic sensors that are used in automotive and marine vehicles.

BACKGROUND OF THE INVENTION

Many modern automotive and marine vehicles are equipped with an electronic control system for regulating various components of the vehicle. The system controls the components based on information represented by output signals from various sensors for detecting operating conditions. Accordingly, if the components or sensors malfunction, the vehicle's performance may be drastically affected and severe damage may result. However, because it is often difficult to distinguish a malfunctioning sensor from other vehicular problems, some type of sensor testing apparatus is necessary.

A number of devices for testing the performance of automotive electronic components have been developed, including both systems specifically directed toward vehicle control systems and testing devices aimed at vehicle electronic devices in general. U.S. Pat. Nos. 4,300,205 to Tansuwan, 4,447,801 to Masuda, 4,962,456 to Abe et al., and 5,235,527 to Ogawa et al. disclose devices specifically directed toward vehicle control systems and sensors.

Tansuwan '205 discloses a device for testing and calibrating a feedback and automatic idle speed control system for automobiles by simulating various operating characteristics of an automobile engine, and then monitoring the response of the control systems. The apparatus simulates the engine operating characteristics by generating output signals which mimic the expected output signals of various sensors. The output signals are transmitted to the control system and then the response of the system is compared to predetermined norms. A disadvantage of Tansuwan '205 is that the device disclosed therein does not test the performance of the vehicle sensors, but rather simulates them. Thus, the device may be useful for testing the control system as a whole, but it cannot diagnose problems with individual sensors. Another disadvantage of this prior art is that because the device simulates only an engine, problems not related to the engine, such as fluid level sensors and temperature sensors cannot be diagnosed.

Masuda '801 and Abe et al. '456 are both directed to systems that monitor a plurality of vehicle conditions and provide an indication of unsatisfactory operation. Masuda '801 discloses an on-board computer system which, upon ignition, tests various conditions using sensors. The sensors transmit electrical signals to a central processing unit (CPU), which determines whether the conditions are within expected ranges. If the sensed conditions are not within expected ranges, the CPU causes a warning light corresponding to the abnormal condition to light. Abe et al. '456 discloses a diagnosis device that interfaces with the control system for an automobile. The device reads electric signals from the vehicle's sensors and compares the signals with the data for the type of vehicle being tested. The type of vehicle must be entered into the device, which stores in computer memory data for various vehicles. The device notes any discrepancies between the stored signals and the actual signals to determine if the vehicle is operating properly.

A disadvantage of Masuda '801 and Abe et al. '456 is that, although both systems test the performance of various operating conditions generally, neither is capable of testing the operation of the sensors. Thus, a diagnosed malfunction may be created by some other component of the vehicle and not by a faulty sensor. Another disadvantage of these prior art systems is that both are computerized devices that contain CPUs and computer memory, making the devices expensive to manufacture. A further disadvantage of Masuda '801 is that the system therein disclosed is an on-board device, and therefore cannot be used to test multiple vehicles. A further disadvantage of Abe et al. '456 is that, because the device checks sensor output against data stored for various vehicles, new or uncommon vehicles for which data is not stored cannot be tested.

Ogawa et al. '527 discloses an on-board system for diagnosing an abnormal state of a sensor. The device converts the analog output of the sensor to a digital signal, forwards the signal to an electronic unit which recognizes the signal as a first value relating to a physical parameter by using data stored beforehand, stores that value relating to the physical parameter by using the stored data as an initial value, and then determines whether or not the parameter has changes by a predetermined value. If the parameter has changed by a predetermined value, the device converts a second analog output to a physical parameter, stores the second value, calculates the difference between the first and second values, and judges whether the difference is within an acceptable range.

A disadvantage of Ogawa et al. '527 is that, like Masuda '801, this diagnostic system is an on-board device, which can only be used to monitor a single vehicle. Another disadvantage of this prior art system is that the device requires an analog-to-digital converter, a CPU, read only memory (ROM), random access memory (RAM), and backup random access memory (B-RAM), thus making the complicated device expensive to manufacture. A further disadvantage of Ogawa et al. '527 is that to test a sensor, it must be installed in a functioning vehicle, making off-vehicle testing impossible.

U.S. Pat. Nos. 3,646,438 to Staff, 4,673,868 to Jones, Jr., and Re. 33,692 to Hirano et al. are directed to testing devices for vehicle electronic components in general.

Staff '438 and Jones, Jr. '868 disclose devices for testing the continuity of circuits employed in electrical components, such as switches, motors, relays, alternators, voltage regulators, and other similar components. With respect to Staff '438, current is passed through various components and the output is evaluated by examining a plurality of indicator lamps, a voltmeter, and an ammeter. By comparing the output of the component with an expected output, the operator can determine if the component is functioning properly. Regarding the Jones, Jr. '868 device, a pair of probes are contacted to two points on the component being tested to form a circuit. An indicator lamp and buzzer on the testing apparatus indicate if and how much current is flowing through the circuit. These indications are then compared to expected results, e.g., whether dim, bright, or no illumination, or whether a soft, loud, or no buzzing, is expected for the particular contact points on the component.

A disadvantage of Staff '438 and Jones, Jr. '868 is that the prior art devices disclosed therein may only be used to test electrical components containing simple circuits. These testing devices may not be able to diagnose malfunctioning sensors because modern sensors contain circuitry more advanced than the electronic components for which the prior art inventions were designed. Another disadvantage of both prior art devices is that the method of determining the results of the test, which requires the operator to compare the output to a chart or list of the expected output, is complicated and time-intensive. Moreover, the operator may lose the chart of expected outcomes, making the testing device useless, or may misread the chart of expected outcomes, corrupting the test.

Hirano et al. '692 discloses a fault diagnosis system for displaying malfunctions detected in automobile electronic devices. The electronic devices output fault diagnoses according to one of a plurality of output signal schemes and also a signal that identifies which scheme the device is outputting. The testing system receives the fault diagnoses and translates the information according to the signal scheme identifier so that any malfunctions may be displayed. A disadvantage of this prior art system is that each individual electronic device must output a fault diagnosis signal. The sensors currently in use do not do this, and thus would not be compatible with the Hirano et al. '692 system. A further disadvantage of this fault diagnosis system is that the device displays only faults affecting whole electronic devices, and not component parts, such as sensors. As such, the testing apparatus cannot pinpoint a fault as being caused by a sensor as opposed to some other component of the electronic device as a whole.

A disadvantage of all of the aforementioned devices is that none of them are capable of testing the functionality of vehicle knock sensors. Neither are the above devices capable of testing the proper functioning of vehicle speed sensors or ignition coils.

What is desired, therefore, is a sensor tester which is capable of testing a plurality of sensor types, including vehicle knock sensors, vehicle speed sensors and ignition coils, which can test individual sensors and not just vehicle components, which can test existing sensors without requiring sensor modification, which can test sensors from multiple vehicles, which can test sensors off-vehicle before they are installed, and which does not require the use of a CPU or computer memory.

SUMMARY OF THE INVENTION

Accordingly, it is an object of the present invention to provide a sensor tester that is capable of testing a plurality of sensor types, including vehicle knock sensors, vehicle speed sensors and ignition coils.

It is another object of the present invention to provide a sensor tester that can test individual sensors and not just vehicle components.

It is a further object of the present invention to provide a sensor tester that can test existing sensors without requiring sensor modification.

It is still another object of the present invention to provide a sensor tester that can test sensors from multiple vehicles.

It is still a further object of the present invention to provide a sensor tester that can test sensors off-vehicle before they are installed.

It is yet another object of the present invention to provide a sensor tester that does not require the use of a CPU or computer memory.

These and other objects and advantages are achieved by a sensor tester for testing multiple vehicle sensors that is capable of testing a plurality of sensor types, including vehicle knock sensors, vehicle speed sensors and ignition coils.

The circuit for testing piezoelectric knock sensors comprises: an integrated circuit electrically connectable to a power source, the integrated circuit having a multiple step voltage divider, a connector for connecting the integrated circuit to the knock sensor; and a plurality of light emitting diodes electrically connected to the voltage divider of the integrated circuit.

The circuit for testing vehicle speed sensors comprises: a voltage divider for limiting the voltage of a power source to a reference voltage; a voltage comparator having a first input, a second input and an output, the first input electrically connected to the voltage divider, the second input electrically connected to the speed sensor; and a voltage transition detector for detecting a voltage transition from the output of the voltage comparator.

The circuit for testing ignition coils that have a primary coil and a secondary coil comprises: capacitance means electrically connectable in a loop with a power source and the primary coil; a first voltage indicator electrically connected in series with a side of the secondary winding and electrically connectable to the power source; a second voltage indicator for detecting a voltage across the capacitance means; a current interrupter electrically connected in parallel with the capacitance means; a first connector for connecting the power source in series with the primary coil; and a second connector for connecting the power source in series with the secondary coil.

The invention and its particular features and advantages will become more apparent from the following detailed description considered with reference to the accompanying drawings.

DETAILED DESCRIPTION OF THE INVENTION

A master automotive sensor tester (11) for testing multiple vehicle sensors is capable of testing a plurality of sensor types. The sensor tester includes a circuit for testing a vehicle piezoelectric knock sensor (10), a circuit for testing a vehicle speed sensor (30), and a circuit for testing ignition coils (50).

Figure 1A:
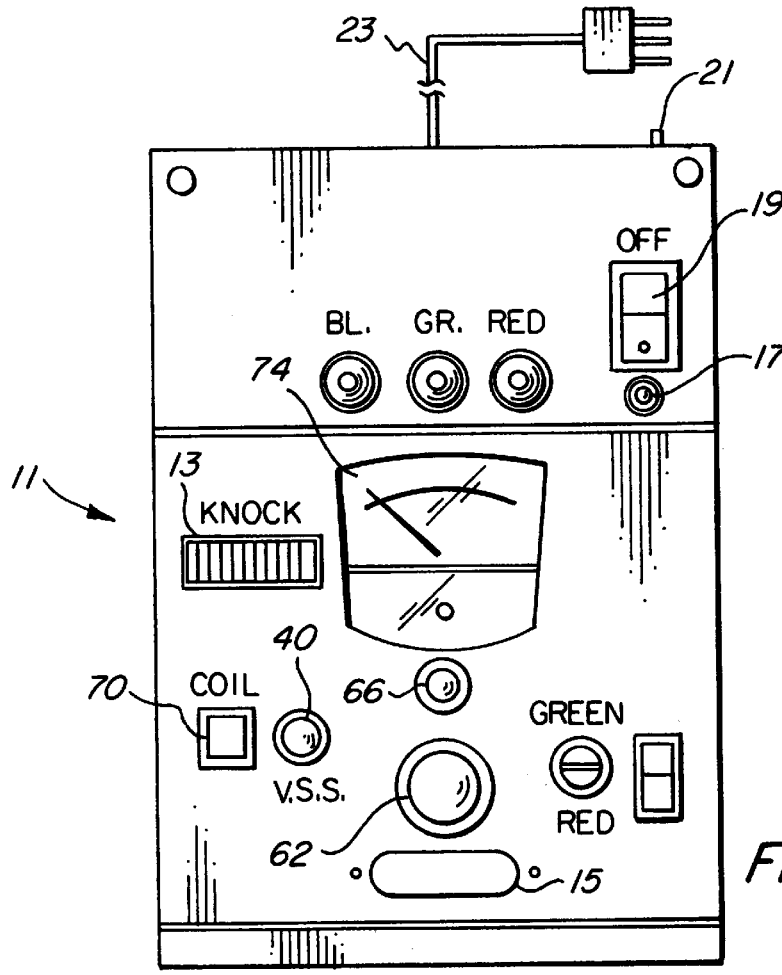
FIGS. 1a and 1b are a top view of the Master sensor tester and a wiring schematic for the 115V A/C input for the master sensor tester, respectively.
Figure 1B:
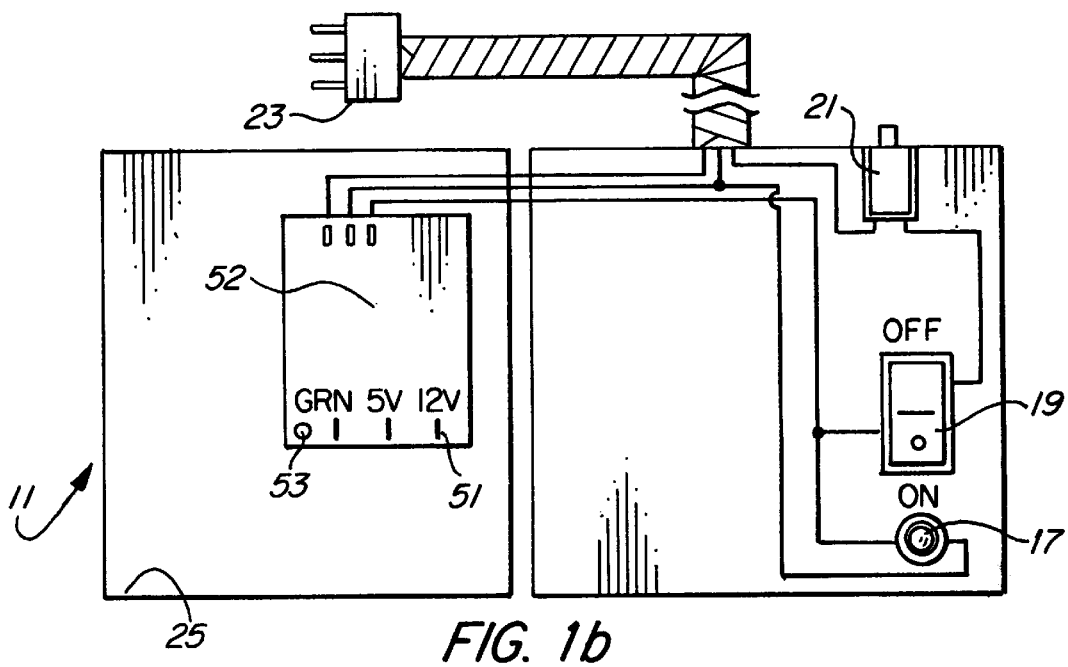

Referring to FIGS. 1a and 1b, the sensor tester (11) has mounted on its case display a ten segment bar graph for the knock sensors (13), a red light emitting diode (LED) for the vehicle speed sensors (40), a momentary switch (70) for testing the ignition coils, a green LED (66) to show operation of the D/C power, a large red LED (62) used for testing the ignition coils, a 15 pin harness connector (15), an A/C green power on light (17), an A/C on/off switch (19), a 115 A/C 2 amperes circuit breaker (21), a 115 volts A/C power cord (23), a 0 to 15 D/C voltmeter (74), a power supply (52), and a case base (25). The 115 volts A/C power cord (23) is wired to a power supply (52) which has a ground terminal (53) and a 12 volt supply terminal (51). The 115 volts A/C power cord (23) is preferably made from 16 gauge wire and given a length of approximately 6 feet.

Knock Sensors

The master sensor tester contains a circuit for testing vehicle knock sensors. The knock sensor is a piezoelectric transducer used to monitor certain conditions with in the internal combustion engine. Strategically located on the block of the engine the sensor is used to monitor engine "knock." Engine knock is caused by several factors, including but not limited to the engine being out of time, using the wrong fuel grade or contaminated fuel, and engine vacuum leaks. The knock or vibration caused by these conditions can vary greatly, and the knock sensor measures this variance. Because the knock sensor is a piezoelectric device, the analog voltage level it sends to the vehice's on board computer is directly proportional to the amount of knock it senses. The analog signal it produces has a wide dynamic range between approximately five micro volts and 13 volts peak-to-peak.

Referring to FIG. 1, the circuit for testing knock sensors (10) is based on an NTE 1509 monolithic integrated circuit (12) powered by a 12 VDC power source (52). The monolithic integrated circuit (12) contains an adjustable voltage reference and an accurate ten step voltage divider. The monolithic integrated circuit (12) also has a high impedance input buffer, which accepts signals down to ground and up to within 1.5 volts of the positive source. The input buffer drives ten individual comparators referenced to the precision divider. Accuracy is typically better than 1 dB.

Pins 2, 4 and 8 of the monolithic integrated circuit (12) are wired to the ground terminal (53). Pins 1, 18, 17, 16, 15, 14, 13, 12, 11 and 10 of the monolithic integrated circuit (12) are each wired to the input of ten light emitting diodes (14) or similar devices for indicating the presence of a voltage, such as ten lamps or lights. Pin 3 of the monolithic integrated circuit (12) is wired to the output of the ten light emitting diodes (14), to the 12V terminal (51), and to a grounded electrolytic capacitor (16). The capacitance of the electrolytic capacitor (16) is of such a value as to dampen voltage oscillations from the power source (52). A 10 micro farad electrolytic capacitor was found to produce the desired result. Pins 6 and 7 of the monolithic integrated circuit (12) are wired to a grounded resistor (18). The resistance of resistor (18) is of such a value as to set the output reference voltage and the light emitting diode current to approximately 10 milliamps. A 380 Ohm resistor was found to produce the desired result. Pin 5 of the monolithic integrated circuit (12) is wired to one end of the knock sensor (20) and to a grounded resistor (22). The other end of the knock sensor (20) is wired to the ground terminal (53). The value of resistor (22) is chosen so as to buffer the input signal to prevent over saturation of the monolithic integrated circuit (12) caused by excessively input levels from the knock sensor (20). A 470K Ohm resistor was found to produce the desired result.

The circuit for testing knock sensors (10) produces a logarithmic 3 dB per step analog display of light emitting diodes (14) which light in sequence based upon the signal strength produced by the knock sensor (20). The threshold levels of the ten light emitting diodes are as follows: 60 MV, 80 MV, 110 MV, 160 MV, 220 MV, 320 MV, 440 MV, 630 MV, 890 MV, and 1.25 V. The light emitting diodes (14) are arranged adjacent each other from the one with the lowest threshold value to the one with the highest to form a bar graph.

In practice, an operator turns on the power source (52) and connects the knock sensor (20) to the circuit for testing knock sensors (10). The operator then gently taps on the knock sensor (20). In a properly functioning knock sensor, all of the light emitting diodes (14) will light sequentially from the one with the lowest threshold value to the one with the highest.

Speed Sensors

The master sensor tester also contains a circuit for testing vehicle speed sensors. The vehicle speed sensor is a device which is used in the automobile to sense vehicle speed and send this information to the vehicle onboard computer. The speed sensor contains an infrared transmitter and receiver that continuously admits infrared light rays. This portion of the sensor is sometimes referred to as the photo eye. It can be placed in front of a cogged fly wheel that rotates at a velocity proportional to the vehicle speed, or can be mounted behind the dash board of the vehicle. There is an apparatus which is mounted to the speedometer which is generally called the reflector blade. The faster the vehicle's speed the faster the reflector blade passes in front of the photo cell of the speed sensor. The infrared light that is emitted from the sensor is reflected back to the receiver portion of the photo eye by the reflector blade. This causes the sensor output to turn "on." When the photo eye is not blocked, the sensor does not receive infrared light back from the reflector blade and the sensor output will be "off." It is this "on" and "off" state that we wish to check for proper operation of the vehicle speed sensors.

Figure 2:
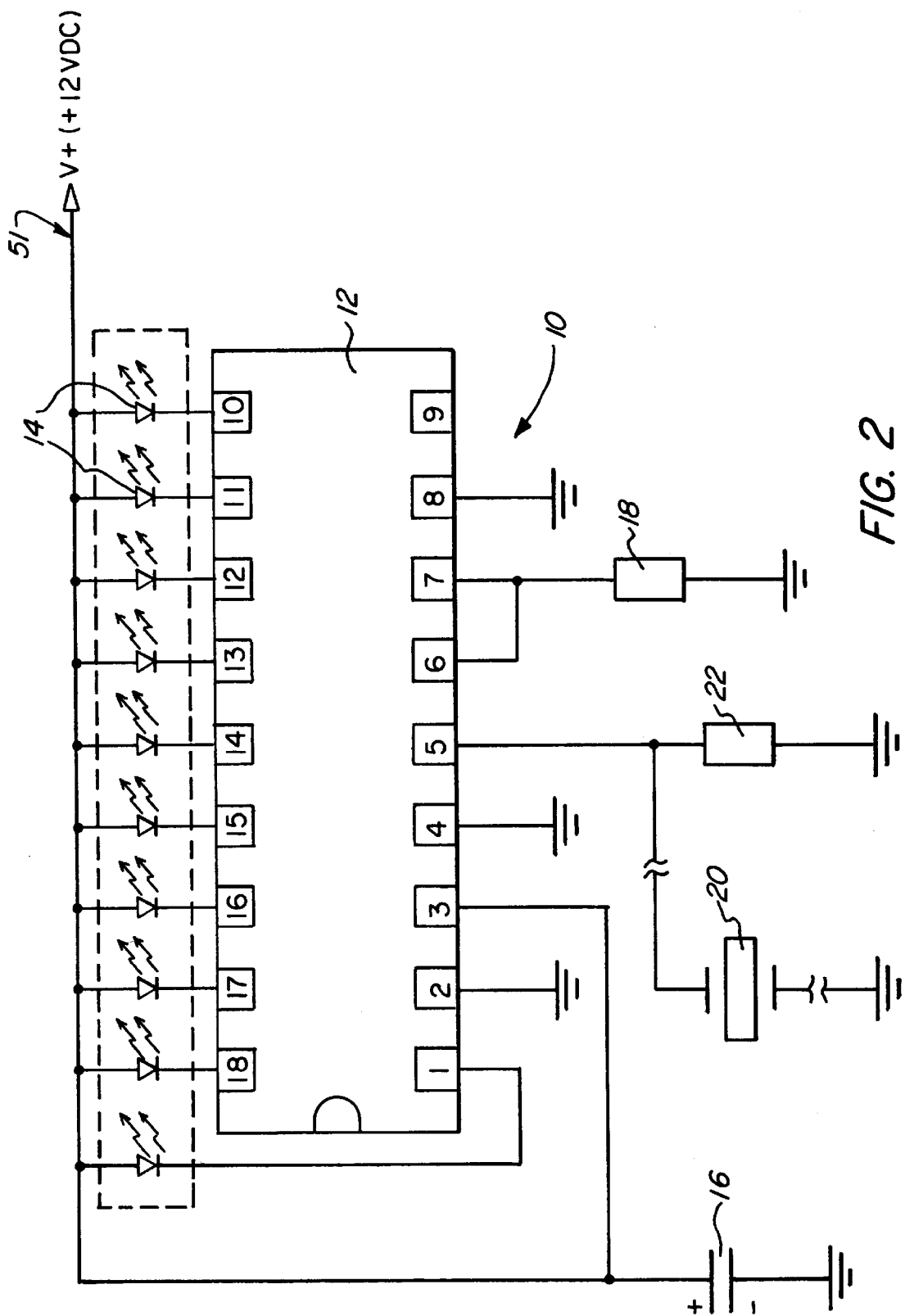
FIG. 2 is a schematic illustration of the electrical components of the circuit for testing a piezoelectric knock sensor of the master sensor tester of FIG. 1.

Referring now to FIG. 2, the circuit for testing vehicle speed sensors (30) is based on a voltage comparator (32). A voltage comparator is an analog circuit that monitors two separate input voltages. A voltage comparator can be made using a standard operational amplifier. One input voltage is called the reference voltage, pin 3 of voltage comparator (32), while the other is called the input voltage, pin 2 of voltage comparator (32). When the input voltage rises above or falls below the reference voltage, the output of the voltage comparator (32), pin 7, changes states.

The 12 VDC terminal (51) of the power source (52) is wired pin 8 of the voltage comparator (32), to a 1K Ohm resistor (34), and to resistor (36). The other side of resistor (36) is wired to resistor (38) and to pin 3 of voltage comparator (32). The other side of resistor (38) is wired to pin 4 of voltage comparator (32), to the output of a light emitting diode (40), and to the ground terminal (53). The output, pin 7, of the voltage comparator (32) is wired to a 100K Ohm resistor (42), with the other side of the 100K Ohm resistor (42) being wired to the base of an NPN transistor (44). The collector of transistor (44) is wired to a side of the 1K Ohm resistor (34). The other side of the resistor (34) is wired to the 12 VDC terminal (51). The emitter of transistor (44) is wired to the input of light emitting diode (40). Pin 2 of the voltage comparator (32) is wired to the output of the vehicle speed sensor (not shown). The transistor and light emitting diode are used together as a voltage transition detector.

A voltage divider comprising two resistors (36, 38) is used to limit the voltage of the power source to obtain a desired reference voltage at pin 3 of the voltage comparator (32). The values of resistor (36) and resistor (38) may vary depending on the reference voltage desired. The reference voltage should be equal to the output voltage of the speed sensor (not shown) in the "off" state. With the reference voltage known, the following equation is used to determine acceptable values for resistor (36) and resistor (38):

$$Vref = 12\ VDC * (R1/(R1+R2))$$

where Vref is the desired reference voltage, R1 is the resistance of resistor (38) and R2 is the resistance of resistor (36). Preferably, resistor (36) is 120K Ohm. For testing standard speed sensors, a corresponding resistor (38) would then range from 0 to 10K Ohms.

The reference voltage holds the output state of the voltage comparator (32) "off" with no applied input voltage. As the vehicle speed sensor (not shown) switches from the "off" state to the "on" state, the input voltage rises above the reference voltage, causing the output of the voltage comparator (32) to turn "on." This then causes the transistor (44) to be forward biased allowing current to flow through the light emitting diode (40) causing it to illuminate. The output of the voltage comparator will remain "on" until the input voltage drops below the reference voltage. At that time the output of the voltage comparator transitions to off, the transistor (44) will become reverse biased, and the light emitting diode (40) will turn off. A transition in the on/off state of the LED is used to detect a transition in the output voltage of the voltage comparator.

In practice, the power source (52) is turned on and the speed sensor (not shown) is connected to the circuit for testing vehicle speed sensors (30). The operator then passes a hand in front of the photo eye of the speed sensor (not shown). In a properly functioning speed sensor, the light emitting diode (40) will light when a hand is passed in front of the photo eye and will turn off when the hand is removed.

Ignition Coils

In addition, the master sensor tester contains a circuit for testing ignition coils. A car's electrical system, based on its battery, provides only 12 volts, which is not powerful enough to generate an ignition spark. The ignition system's ignition coil, however, can generate a high-voltage electric pulse (up to 30,000 volts) from the car's 12-volt electrical system. The coil is made up of two sets of wire windings, one nested inside the other. When the key is turned in the ignition switch, current flows from the battery to the starter motor to the outer, or primary, windings of the ignition coil, which creates a magnetic field. When the electricity is turned off the field collapses, producing an extremely high voltage in the inner, or secondary, windings. This high voltage is used to create the ignition spark at the spark plug. The master sensor tester contains a circuit for testing both the primary and secondary windings of ignition coils.

Figure 3:
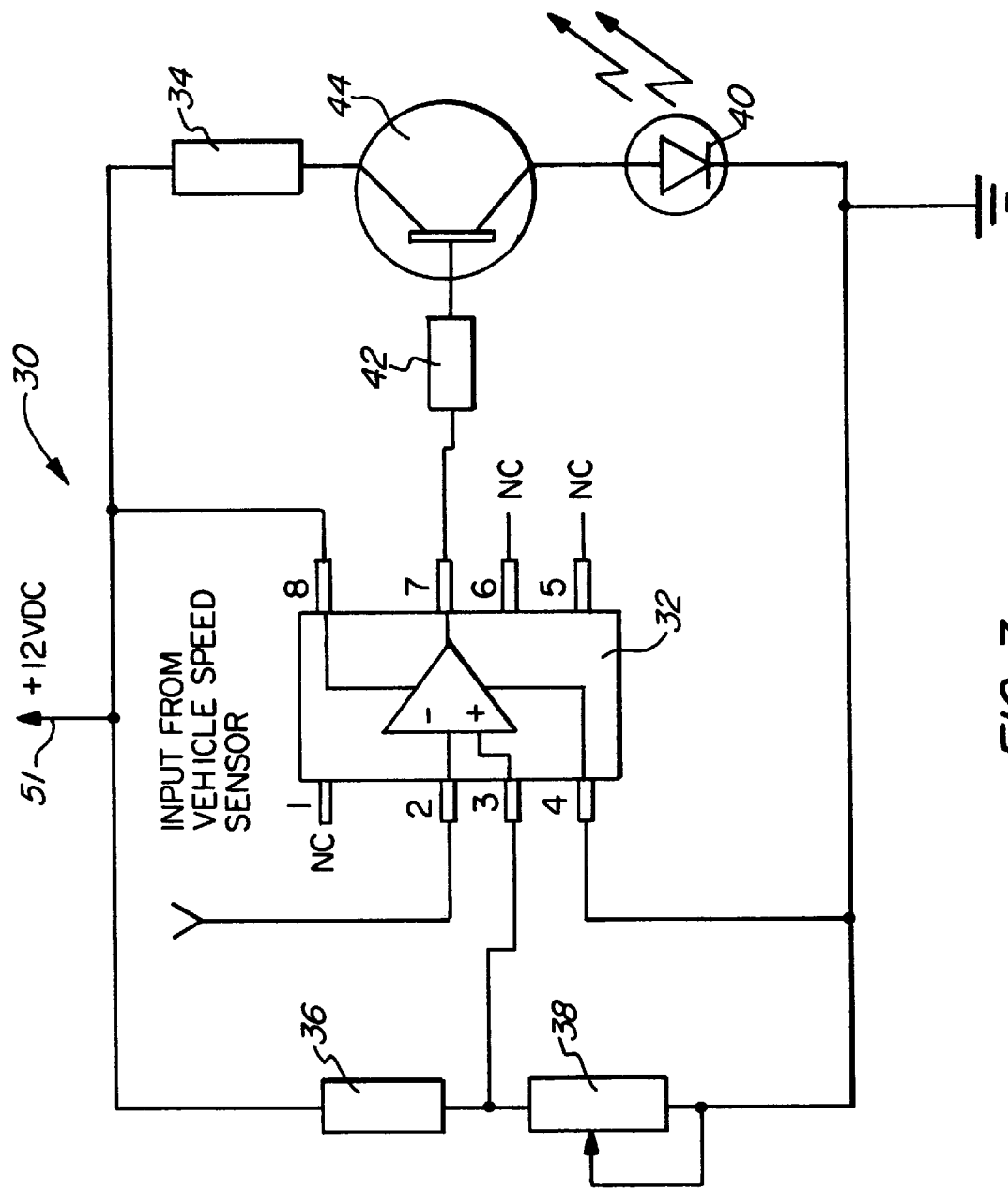
FIG. 3 is a schematic illustration of the electrical components of the circuit for testing a vehicle speed sensor of the master sensor tester of FIG. 1.
Figure 4A:
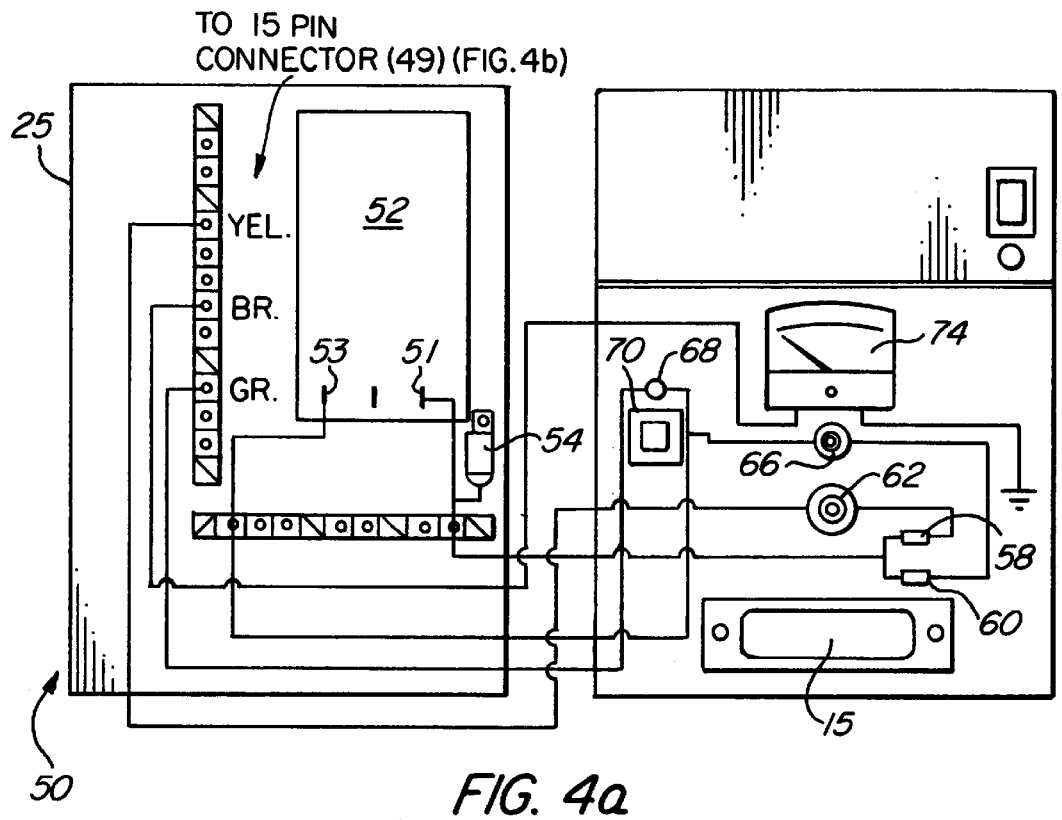
FIGS. 4a and 4b are schematic illustrations of the electrical components of first and second portions of the circuit for testing ignition coils of the master sensor tester of FIG. 1.
Figure 4B:
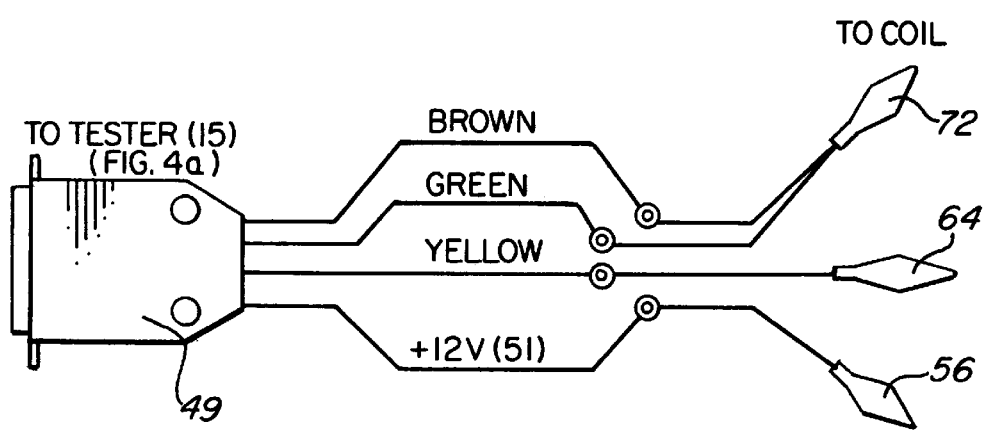
Figure 5:
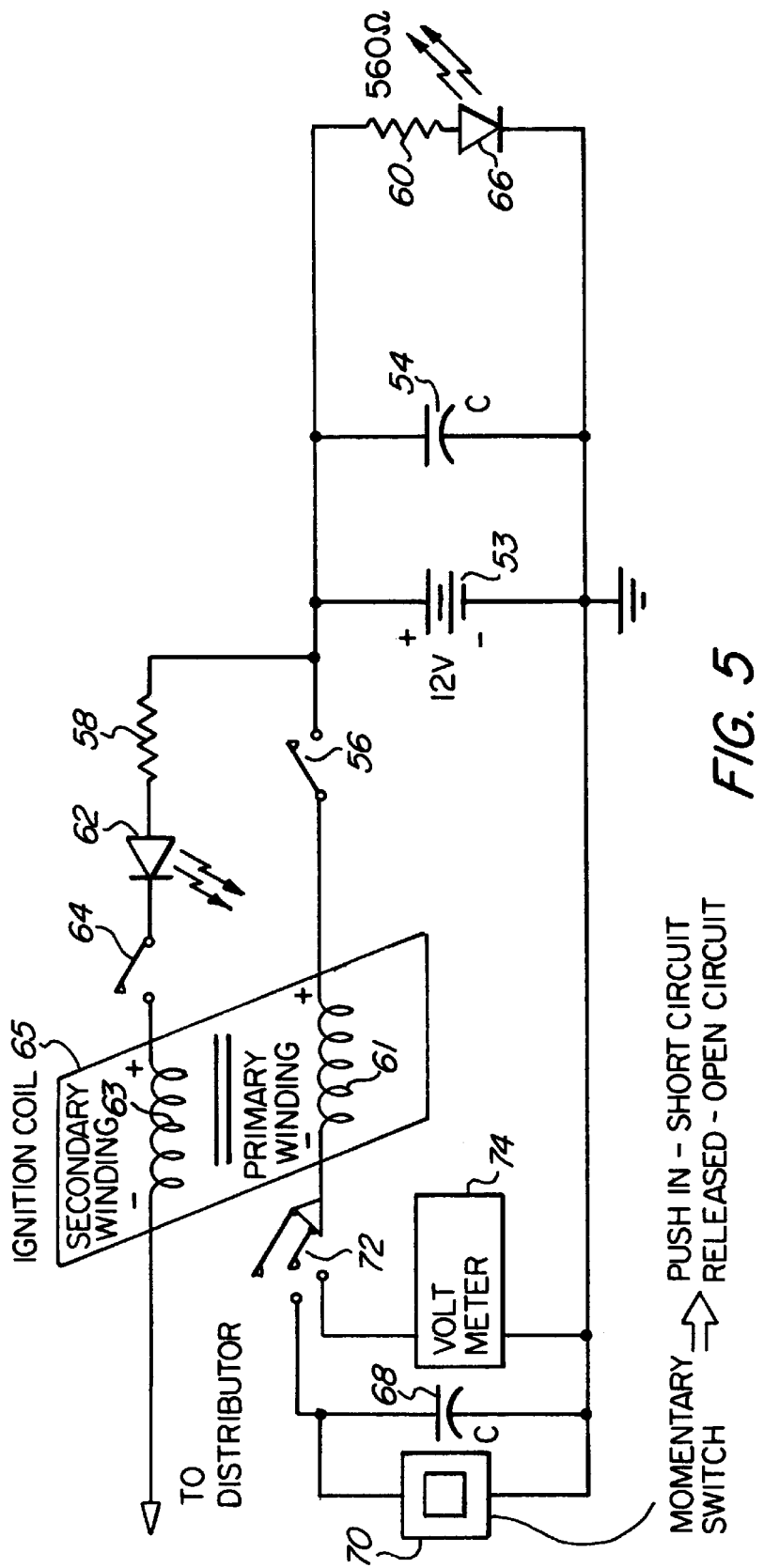
FIG. 5 is a circuit diagram of the circuit for testing ignition coils of the master sensor tester of FIG. 1.

Referring to FIGS. 3–5, the circuit for testing ignition coils (50) contains a 12 VDC power source (52). The 12 volt terminal (51) of the power source (52) is wired to a side of capacitor (54) and to an alligator clip (56) which can be connected to the positive side of the primary winding (61) of the ignition coil (65). The other side of capacitor (54) is mounted to the case base (25). The 12 volt terminal (51) of the power source (52) is also wired to a first side of resistor (58) and to a first side of resistor (60). The second side of resistor (58) is wired to the anode of light emitting diode (62), with the cathode of light emitting diode (62) being wired to an alligator clip (64), which can be connected to the positive side of the secondary winding (63) of the ignition coil (65). The negative side of the secondary winding (63) may be connected to a distributor (not shown). The second side of resistor (60) is wired to the anode of light emitting diode (66). The cathode of light emitting diode (66) is wired to a second side of capacitor (68), to a second side of momentary switch (70) and to the ground terminal (53) of the power source (52). The momentary switch (70) acts like a short circuit when it is pushed in and an open circuit when it is released. Capacitor (68) acts as a current buffer across the momentary switch (70) when the magnetic field of the primary winding (61) collapses. The first sides of capacitor (68) and momentary switch (70) are wired to an alligator clip (72), which can be attached to the negative side of the primary winding (61) of the ignition coil. Alligator clip (72) is also wired to the positive side of a volt meter (74), with the negative side of volt meter (74) being wired to the ground terminal (53).

Preferably, the capacitor (54) or similar device having capacitance has a value of 0.15 micro farads. The resistance of resistor (58) is preferably 470 Ohms, while the resistance of resistor (60) is preferably 560 Ohms. Also, preferably, the capacitance of capacitor (68) is 0.47 micro farads. In addition, the volt meter (74) preferably measures a range of voltages from 0 to 15 volts and has a high input resistance. Further, light emitting diode (62) and light emitting diode (66) are preferably different colors relative to each other to facilitate reading of the results by the operator. The light emitting diodes can be replaced by other voltage indicators such as lights. The momentary device (70) can be replaced by a current interruption device such as an appropriate switch.

In practice, an operator turns on the power source (52), attaches the alligator clip (56) to the positive side of the primary winding (61) of the ignition coil (65), attaches the alligator clip (72) to the negative side of the primary winding (61) of the ignition coil (65) and inserts the 15 pin connector (49) into the 15 pin harness connector (15) on the master sensor tester (11). Light emitting diode (66) should then light up. If the primary winding of the ignition coil is functioning properly, the volt meter (74) will read approximately 12 volts. If not, the primary winding (61) is defective. If the primary winding (61) is functioning properly, the operator then attaches alligator clip (64) to the secondary winding (63) of the ignition coil (65). The operator then pushes in and releases the momentary switch (70) which interrupts the current and creates a short circuit around capacitor (68). If the secondary winding of the ignition coil is functioning properly, the volt meter (74) should read approximately ½ to 1 volt while the momentary switch (70) is pressed in. When the momentary switch is released, capacitor (68) charges, the current through the primary winding (61) decreases rapidly and the magnetic field of the primary winding (61) collapses. If the secondary winding of the ignition coil is functioning properly, the collapse of the magnetic field of the primary winding (61) will create a momentary high voltage in the secondary winding (63) and light emitting diode (62) will flash momentarily, indicating a momentary high voltage.

Although the invention has been described with reference to a particular arrangement of parts, features and the like, these are not intended to exhaust all possible arrangements or features, and indeed many other modifications and variations will be ascertainable to those of skill in the art.

What is claimed is:

1. A master sensor tester for testing multiple vehicle sensors, comprising:
   a circuit for testing a piezoelectric knock sensor, comprising:
   a multiple step voltage divider electrically connectable to a power source and electrically connectable to the knock sensor; and
   a plurality of voltage indicators electrically connected to the voltage divider;
   a circuit for testing a vehicle speed sensor, comprising:
   a voltage divider for limiting the voltage of the power source to a reference voltage;
   a voltage comparator having a first input, a second input and an output, said first input electrically connected to the reference voltage of said voltage divider, said second input electrically connected to the speed sensor; and a voltage transition detector for detecting a voltage transition from said output of the voltage comparator;

a circuit for testing for ignition coils having a primary coil and a secondary coil, comprising:

capacitance means electrically connectable in a loop with the power source and the primary coil;

a first voltage indicator electrically connected in series with a side of the secondary winding and electrically connectable in series to the power source;

a voltage meter for detecting a voltage across said capacitance means;

a current interrupter electrically connected in parallel with the capacitance means;

a first connector for connecting the power source in series with the primary coil; and a second connector for connecting the power source in series with the secondary coil.

2. A circuit for testing a piezoelectric knock sensor comprising:

a multiple step voltage divider electrically connectable to a power source and electrically connectable to the knock sensor; and a plurality of voltage indicators electrically connected to the voltage divider of an integrated circuit, wherein said multiple step voltage divider is housed in said integrated circuit that has an adjustable output voltage, and further comprising a current limiter for setting the output reference voltage of said integrated circuit and the light emitting diode current to approximately ten milliamps.

3. The circuit for testing a piezoelectric knock sensor of claim 2 wherein said current limiter comprises a grounded resistor electrically connected to said integrated circuit.

4. The circuit for testing a piezoelectric knock sensor of claim 2 further comprising an input signal buffer for buffering the input signal so as to prevent over saturation of said integrated circuit.

5. The circuit for testing a piezoelectric knock sensor of claim 4 wherein said input signal buffer comprises a grounded resistor electrically connected to said integrated circuit and the knock sensor.

6. The circuit for testing a piezoelectric knock sensor of claim 2 further comprising electrical oscillation dampener for dampening electrical oscillations from the power source.

7. The circuit for testing a piezoelectric knock sensor of claim 6 wherein said electrical oscillation dampener comprises a capacitor having an anode and a cathode, said capacitor anode being electrically connectable to the power source, said cathode being electrically connected to ground.

8. The circuit for testing a piezoelectric knock sensor of claim 2 wherein the multiple step voltage divider comprises a ten step voltage divider and wherein said plurality of voltage indicators comprises ten light emitting diodes.

9. A circuit for testing a piezoelectric knock sensor comprising:

an integrated circuit being electrically connectable to a power source, the integrated circuit having an adjustable voltage reference and a multiple step voltage divider;

a connector for electrically connecting said integrated circuit to the knock sensor;

an input signal buffer as to prevent over saturation of said circuit;

a plurality of light emitting diodes electrically connected to the voltage divider of said integrated circuit;

a means for setting the output reference voltage of said integrated circuit and the light emitting diode current to approximately ten milliamps; and a power source voltage oscillation dampener connectable to the power source.

10. The circuit for testing a piezoelectric knock sensor of claim 9 further comprising a first grounded resistor electrically connected to said integrated circuit and the knock sensor for buffering the input signal so as to prevent over saturation of said integrated circuit.

11. The circuit for testing a piezoelectric knock sensor of claim 10 further comprising a second grounded resistor electrically connected to said integrated circuit for setting the output reference voltage of said integrated circuit and the light emitting diode current to approximately ten milliamps; and a grounded capacitor electrically connected to said integrated circuit and to said plurality of light emitting diodes for dampening electrical oscillations in said plurality of light emitting diodes.

12. The circuit for testing a piezoelectric knock sensor of claim 11 wherein the multiple step voltage divider comprises a ten step voltage divider and wherein said plurality of light emitting diodes comprises ten light emitting diodes.

* * * * *